(12) United States Patent
Lin

(10) Patent No.: US 12,457,759 B2
(45) Date of Patent: Oct. 28, 2025

(54) SEMICONDUCTOR ARRANGEMENT AND METHOD OF MANUFACTURE

(71) Applicant: TAIWAN SEMICONDUCTOR MANUFACTURING COMPANY LIMITED, Hsin-Chu (TW)

(72) Inventor: Hung-Te Lin, Hsin-Chu (TW)

(73) Assignee: TAIWAN SEMICONDUCTOR MANUFACTURING COMPANY LIMITED, Hsin-chu (TW)

( * ) Notice: Subject to any disclaimer, the term of this patent is extended or adjusted under 35 U.S.C. 154(b) by 161 days.

(21) Appl. No.: 17/693,604

(22) Filed: Mar. 14, 2022

(65) Prior Publication Data

US 2023/0028453 A1    Jan. 26, 2023

Related U.S. Application Data

(60) Provisional application No. 63/224,904, filed on Jul. 23, 2021.

(51) Int. Cl.
*H10D 12/00*    (2025.01)
*H10D 12/01*    (2025.01)
(Continued)

(52) U.S. Cl.
CPC .......... *H10D 12/411* (2025.01); *H10D 12/01* (2025.01); *H10D 62/137* (2025.01); *H10D 64/01* (2025.01)

(58) Field of Classification Search
CPC ... H01L 29/0804–0834; H01L 29/1004; H01L 29/0821; H01L 29/401; H01L 29/41708; H01L 29/42304; H01L 29/66234–66348; H01L 29/66325; H01L 29/66333–66348; H01L 29/0692; H01L 29/0696; H01L 27/088; H01L 27/0922; H01L 21/823418; H01L 21/8222; H01L 21/8229; H01L 21/8249; H01L 29/1095; H01L 29/73–7378; H01L 29/7375; H01L 29/7393–7395; H01L 29/7397; H01L 29/7398; H10D 12/411; H10D 12/01; H10D 12/031; H10D 12/032; H10D 12/421;
(Continued)

(56) References Cited

U.S. PATENT DOCUMENTS 5,001,075 A * 3/1991 Boland ............. H01L 21/76297
                                                           438/355
5,095,351 A * 3/1992 Gotou ................... H01L 29/417
                                                          257/256
(Continued)

FOREIGN PATENT DOCUMENTS

EP           338312 B1 *  1/1993  ......... H01L 29/0834

*Primary Examiner* — Natalia A Gondarenko
(74) *Attorney, Agent, or Firm* — Cooper Legal Group, LLC

(57) ABSTRACT

A semiconductor arrangement and method of manufacture is provided. In some embodiments, a semiconductor arrangement includes a collector region having a first surface coplanar with a first surface of a semiconductor layer, a drift region over a portion of the collector region and having a first surface coplanar with the first surface of the semiconductor layer, and a body region over the drift region. A body contact is in the body region. An emitter contact contacts the body contact and the body region. A collector contact contacts the first surface of the collector region. A first gate structure is adjacent the first surface of the drift region, the body region, and the body contact.

20 Claims, 10 Drawing Sheets

(51) Int. Cl.
*H10D 62/13* (2025.01)
*H10D 64/01* (2025.01)

(58) Field of Classification Search
CPC .. H10D 12/441; H10D 12/491; H10D 62/126;
H10D 62/133; H10D 62/137; H10D
62/141; H10D 62/145; H10D 64/01;
H10D 64/231; H10D 64/232; H10D
64/68; H10D 64/681; H10D 84/0121;
H10D 84/101; H10D 84/161; H10D
84/013; H10D 84/038; H10D 84/401;
H10D 84/641; H10D 84/83; H10D
84/856
USPC .................................. 257/141, 133, E29.198
See application file for complete search history.

(56) References Cited

U.S. PATENT DOCUMENTS

| | | | | |
|---|---|---|---|---|
| 2005/0082640 A1* | 4/2005 | Takei | ................... | H02M 7/003 |
| | | | | 257/E29.198 |
| 2008/0135870 A1* | 6/2008 | Okada | ................. | H01L 29/7395 |
| | | | | 257/E29.037 |
| 2014/0339600 A1* | 11/2014 | Yoshikawa | ......... | H01L 29/7395 |
| | | | | 257/139 |
| 2021/0057521 A1* | 2/2021 | Gauthier | ............. | H01L 29/7322 |

* cited by examiner

SEMICONDUCTOR ARRANGEMENT AND METHOD OF MANUFACTURE

RELATED APPLICATION

This application claims priority to U.S. Provisional Patent Application 63/224,904 titled "SEMICONDUCTOR ARRANGEMENT AND METHOD OF MANUFACTURE" and filed on Jul. 23, 2021, which is incorporated herein by reference.

BACKGROUND

Semiconductor arrangements are used in a multitude of electronic devices, such as consumer products, industrial electronics, appliances, aerospace devices, and transportation devices. Some semiconductor arrangements include insulated-gate bipolar transistors (IGBTs). An IGBT is a device that combines the input impedance and switching speed of a metal-oxide-semiconductor field-effect transistor (MOSFET) with the conductivity characteristics of a bipolar junction transistor (BJT).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
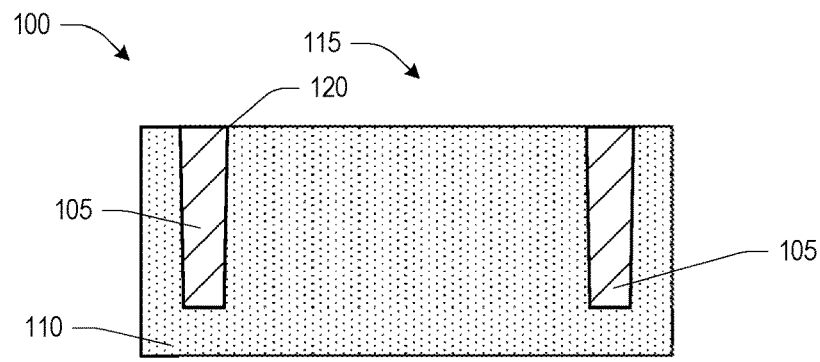
FIGS. 1-10 are illustrations of a semiconductor arrangement at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present application relates to a semiconductor arrangement and a method for fabricating a semiconductor arrangement. According to some embodiments, an integrated gate bipolar transistor (IGBT) is formed in a recess to provide a vertical IGBT structure with planar contacts on an upper surface of the IGBT structure. In some embodiments, a collector region is formed in the recess, a drift region is formed in the recess over the collector region, and a body region is formed over the drift region. Surfaces of the collector region, the drift region, and the body region may be coplanar. An emitter contact contacts the body region and a body contact formed in the body region. A collector contact contacts the collector region. When the surfaces of the collector region, the drift region, and the body region are coplanar surfaces, the emitter contact and the collector contact may also be coplanar. A gate structure is formed over the drift region, the body region, and the body contact. In some embodiments, the gate structure is planar. In some embodiments, the gate structure is formed in a trench.

FIGS. 1-10 illustrate a semiconductor arrangement 100 at various stages of fabrication, in accordance with some embodiments. Referring to FIG. 1, a deep trench isolation (DTI) structure 105 is formed in a semiconductor layer 110, in accordance with some embodiments. An active region 115 is bounded by the DTI structure 105. For example, the DTI structure 105 may surround the active region 115 to electrically isolate the active region 115 from other regions, such as regions where other types of devices are formed. In some embodiments, the semiconductor layer 110 is part of a substrate comprising at least one of an epitaxial layer, a single crystalline semiconductor material such as, but not limited to, at least one of Si, Ge, SiGe, InGaAs, GaAs, InSb, GaP, GaSb, InAlAs, GaSbP, GaAsSb, or InP, a silicon-on-insulator (SOI) structure, a wafer, or a die formed from a wafer. In some embodiments, the semiconductor layer 110 comprises at least one of crystalline silicon or other suitable materials. Other structures and/or configurations of the semiconductor layer 110 are within the scope of the present disclosure.

In some embodiments, the DTI structure 105 is formed by forming at least one mask layer over the semiconductor layer 110. In some embodiments, the at least one mask layer comprises a layer of oxide material over the semiconductor layer 110 and a layer of nitride material over the layer of oxide material, and/or one or more other suitable layers. At least some of the at least one mask layer is removed to define an etch mask for use as a template to etch the semiconductor layer 110 to form a trench. A dielectric material is formed in the trench to define the DTI structure 105. In some embodiments, the DTI structure 105 includes multiple layers, such as an oxide liner, a nitride liner formed over the oxide liner, an oxide fill material formed over the nitride liner, and/or other suitable materials.

In some embodiments, a fill material is formed using a high density (HDP) plasma process. The HDP process uses precursor gases comprising at least one of silane ($SiH_4$), oxygen, argon, or other suitable gases. The HDP process includes a deposition component, which forms material on surfaces defining the trench, and a sputtering component, which removes or relocates deposited material. A deposition-to-sputtering ratio depends on gas ratios employed during the deposition. According to some embodiments, argon and oxygen act as sputtering sources, and the particular values of the gas ratios are determined based on an aspect ratio of the trench. After forming the fill material, an anneal process is performed to densify the fill material. In some embodiments, the DTI structure 105 generates compressive stress that serves to compress the active region 115. Other structures and/or configurations of the DTI structure 105 are within the scope of the present disclosure.

Although the semiconductor layer 110 and the DTI structure 105 are illustrated as having coplanar upper surfaces at an interface 120 where the semiconductor layer 110 abuts the DTI structure 105, the relative heights can vary. For example, the DTI structure 105 can be recessed relative to the semiconductor layer 110, or the semiconductor layer 110 can be recessed relative to the DTI structure 105. The relative heights at the interface 120 depend on the processes performed for forming the DTI structure 105, such as at least one of deposition, planarization, mask removal, surface treatment, or other suitable techniques.

Figure 2:
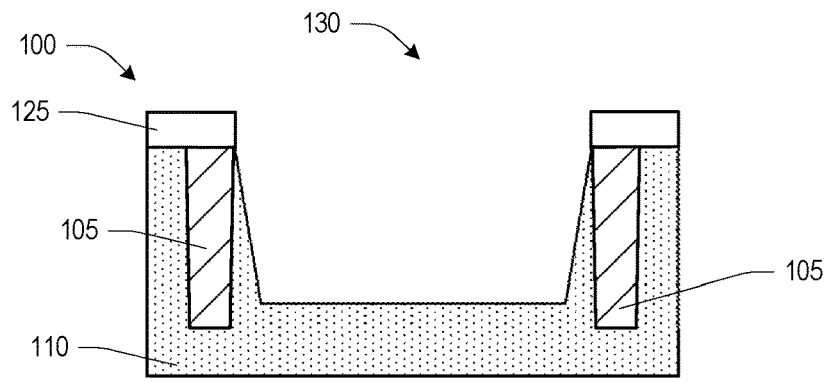

Referring to FIG. 2, a mask 125 is formed over the semiconductor layer 110 and a recess 130 is formed in the semiconductor layer 110 using the mask 125 as a removal template, in accordance with some embodiments. According to some embodiments, the mask 125 comprises a plurality of individually formed layers that together define a mask stack. In some embodiments, the mask 125 comprises at least one of a hard mask layer, a bottom antireflective coating (BARC) layer, an organic planarization layer (OPL), or a photoresist layer. The hard mask layer is formed by at least one of physical vapor deposition (PVD) (e.g., sputtering and/or evaporation), chemical vapor deposition (CVD) (e.g., low pressure CVD (LPCVD), ultrahigh vacuum CVD (UHVCVD), reduced pressure CVD (RPCVD), plasma-enhanced CVD (PECVD), and/or atmospheric pressure CVD (APCVD)), spin on, growth, or other suitable techniques. In some embodiments, the hard mask layer comprises at least one of silicon and oxygen, silicon and nitrogen, nitrogen, silicon (e.g., polycrystalline silicon), or other suitable materials. In some embodiments, the BARC layer is a polymer layer that is applied using a spin coating process. In some embodiments, the OPL comprises a photo-sensitive organic polymer that is applied using a spin coating process. In some embodiments, the OPL comprises a dielectric layer. In some embodiments, the photoresist layer is formed by at least one of spinning, spray coating, or other suitable techniques. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer. The layers of the mask stack are patterned to define the mask 125. In some embodiments, the photoresist layer is exposed using a radiation source and a reticle to define a pattern in the photoresist layer, and portions of the photoresist layer are removed to define a patterned photoresist layer. The underlying OPL, BARC layer, and hard mask layer are etched using the patterned photoresist layer as a template to form the mask 125 and expose portions of the semiconductor layer 110 under the mask 125.

In some embodiments, the recess 130 is formed in the semiconductor layer 110 by performing an etching processes to remove portions of the semiconductor layer 110 exposed by the mask 125. The etching process comprises at least one of a plasma etching process, a reactive ion etching (RIE) process, or other suitable techniques. In some embodiments, the recess 130 is a trench. Other structures and configurations of the recess 130 are within the scope of the present disclosure.

Figure 3:
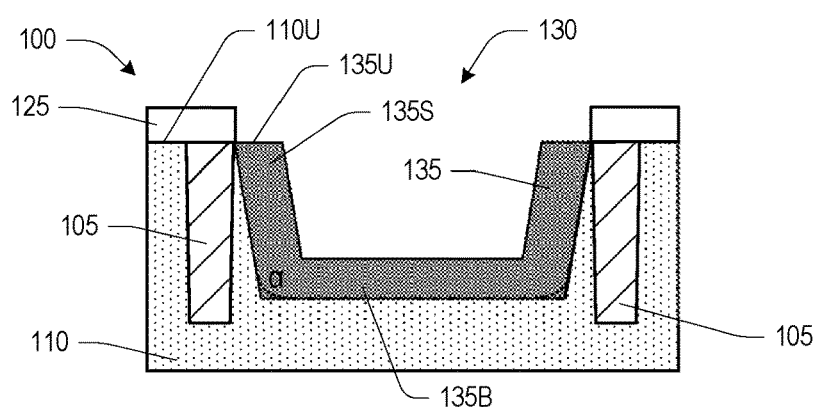

Referring to FIG. 3, a collector region 135 is formed in the recess 130. In some embodiments, an epitaxial growth process is performed to form the collector region 135. In some embodiments, an impurity is introduced into the collector region 135 during the epitaxial growth process. The impurity may be a p-type dopant, such as at least one of boron, $BF_2$, aluminum, gallium, indium, or other suitable p-type dopants. In some embodiments, the collector region 135 is u-shaped and includes a bottom portion 135B and a sidewall portion 135S extending from the bottom portion 135B. The sidewall portion 135S has a surface 135U substantially coplanar with an upper surface 110U of the semiconductor layer 110. In some embodiments, an angle, $\alpha$, between the sidewall portion 135S and the bottom portion 135B is at least about 85 degrees. In some embodiments, a process is performed to round inside corners of the recess 130 prior to forming the collector region 135 as indicated by dashed lines.

Figure 4:
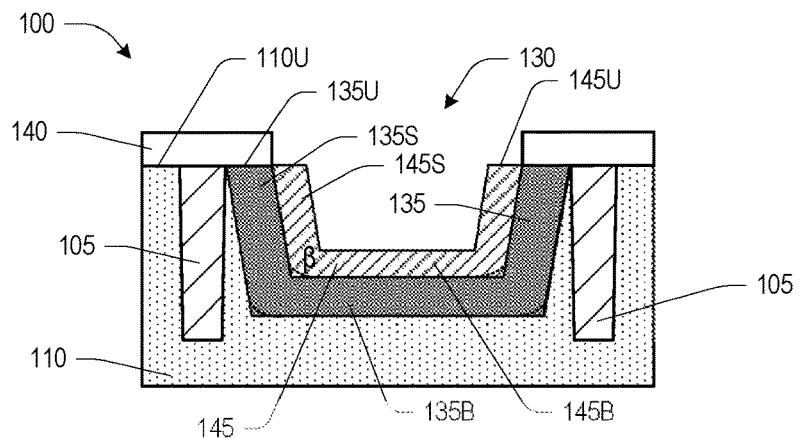

Referring to FIG. 4, the mask 125 is removed, a mask 140 is formed over the semiconductor layer 110 and the surface 135U of the collector region 135, and a buffer layer 145 is formed in the recess 130 over the collector region 135, in accordance with some embodiments. In some embodiments, the mask 140 is formed using at least one of a hard mask layer, a BARC layer, an OPL, or a photoresist layer comprising materials and formed as described herein. In some embodiments, an epitaxial growth process is performed to form the buffer layer 145. In some embodiments, an impurity is introduced into the buffer layer 145 during the epitaxial growth process. The impurity may be an n-type dopant, such as at least one of phosphorous, arsenic, or other suitable n-type dopants. In some embodiments, the buffer layer 145 includes a bottom portion 145B and a sidewall portion 145S extending from the bottom portion 145B. The sidewall portion 145S has a surface 145U substantially coplanar with the upper surface 110U of the semiconductor layer 110. In some embodiments, an angle, $\beta$, between the sidewall portion 135S and the bottom portion 135B is at least about 85 degrees. In some embodiments, a process is performed to round inside corners of the collector region 135 prior to forming the buffer layer 145 as indicated by dashed lines. In some embodiments, the surface 145U of the buffer layer 145 is substantially coplanar with the surface 135U of the collector region 135. In some embodiments, the buffer layer 145 is omitted. For example, the buffer layer 145 is provided in a punch through IGBT device, and the buffer layer 145 is omitted in a non-punch through IGBT device.

Figure 5:
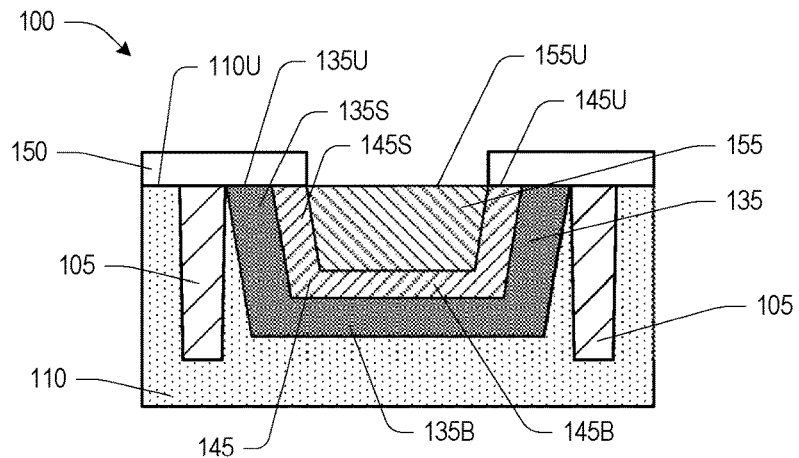

Referring to FIG. 5, the mask 140 is removed, a mask 150 is formed over the semiconductor layer 110, the surface 135U of the collector region 135, and the surface 145U of the buffer layer 145, and a drift region 155 is formed in the recess 130 over the buffer layer 145, in accordance with some embodiments. In some embodiments, the mask 150 is formed using at least one of a hard mask layer, a BARC layer, an OPL, or a photoresist layer comprising materials and formed as described herein. In some embodiments, an epitaxial growth process is performed to form the drift region 155. In some embodiments, the drift region 155 is undoped, and a masked implantation process is performed to introduce an impurity into the drift region 155. Alternatively, the impurity is introduced into the drift region 155 during the epitaxial growth process. The impurity may be an n-type dopant, such as at least one of phosphorous, arsenic, or other suitable n-type dopants. In some embodiments, the drift region 155 has a surface 155U substantially coplanar with the upper surface 110U of the semiconductor layer 110. In some embodiments, the surface 155U of the drift region 155 is substantially coplanar with the surface 135U of the collector region 135 and/or the surface 145U of the buffer layer 145.

Figure 6:
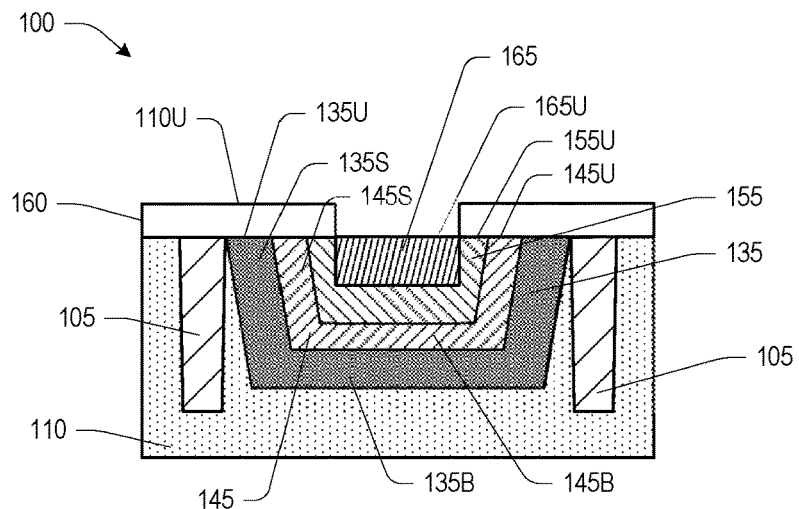

Referring to FIG. 6, the mask 140 is removed, a mask 160 is formed over the semiconductor layer 110, the surface 135U of the collector region 135, the surface 145U of the buffer layer 145, and a portion of the surface 155U of the drift region 155, and a body region 165 is formed in the drift region 155, in accordance with some embodiments. In some embodiments, the mask 160 is formed using at least one of a hard mask layer, a BARC layer, an OPL, or a photoresist layer comprising materials and formed as described herein. In some embodiments, an implantation process using the mask 160 as an implantation template is performed to introduce an impurity into the drift region 155 to form the body region 165. The impurity may be a p-type dopant, such as at least one of boron, $BF_2$, aluminum, gallium, indium, or other suitable p-type dopants. In some embodiments, the body region 165 has a surface 165U substantially coplanar with the upper surface 110U of the semiconductor layer 110. In some embodiments, the surface 165U of the body region 165 is substantially coplanar with the surface 135U of the collector region 135, the surface 145U of the buffer layer 145, and/or the surface 155U of the drift region 155.

Figure 7:
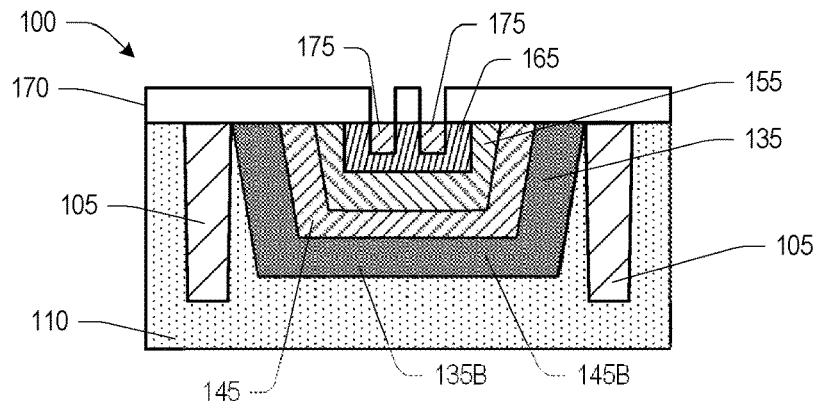

Referring to FIG. 7, the mask 160 is removed, a mask 170 is formed over the semiconductor layer 110, the surface 135U of the collector region 135, the surface 145U of the buffer layer 145, the portion of the surface 155U of the drift region 155, and portions of the body region 165, and body contacts 175 are formed in the body region 165, in accordance with some embodiments. In some embodiments, the mask 170 is formed using at least one of a hard mask layer, a BARC layer, an OPL, or a photoresist layer comprising materials and formed as described herein. In some embodiments, an implantation process using the mask 170 as an implantation template is performed to introduce an impurity into the body region 165 to form the body contacts 175. The impurity may be an n-type dopant, such as at least one of phosphorous, arsenic, or other suitable n-type dopants.

In some embodiments, the collector region 135 has a p++ dopant concentration (e.g., $10^{15}$-$10^{17}$/cm$^2$), the buffer region 145 has a n+ dopant concentration (e.g., $10^{15}$-$10^{16}$/cm$^2$), the drift region 155 has an n– dopant concentration (e.g., $10^{12}$-$10^{14}$/cm$^2$), the body region 165 has a p dopant concentration (e.g., $10^{12}$-$10^{14}$/cm$^2$), and the body contacts 175 have an n+ dopant concentration (e.g., $10^{15}$-$5*10^{17}$/cm$^2$). The relative indicator "++" indicates a highly doped region having a higher dopant concentration than a medium doped region having the relative indicator "+" or a doped region having no indicator (e.g., "p"). The relative indicator "+" indicates a medium doped region having a higher dopant concentration than a lightly doped region having the relative indicator "–". Two regions with the same relative indicator do not necessarily have the same absolute dopant concentration. In some embodiments, the polarities of the regions are reversed to form a device having the opposite conductivity type. For example, in a device of opposite conductivity type, the collector region 135 has an n++ dopant concentration, the buffer region 145 has a p+ dopant concentration, the drift region 155 has a p– dopant concentration, the body region 165 has an n– dopant concentration, and the body contacts 175 have a p+ dopant concentration.

Figure 8:
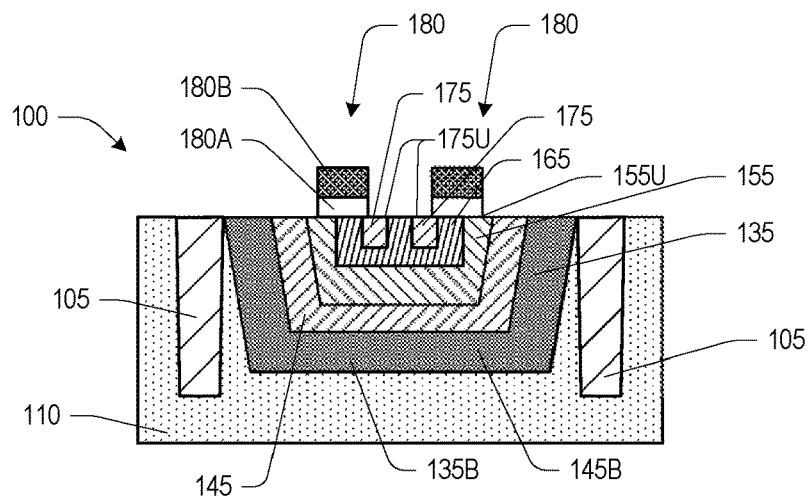

Referring to FIG. 8, the mask 170 is removed and gate structures 180 are formed, in accordance with some embodiments. In some embodiments, the gate structures 180 are formed over a portion of the surface 155U of the drift region 155, a portion of the surface 165U of the body region 165, and a portion of the surfaces 175U of the body contacts 175. According to some embodiments, the gate structures 180 comprise a gate dielectric layer 180A and a gate electrode layer 180B. In some embodiments, the gate dielectric layer 180A and the gate electrode layer 180B are formed by forming a layer of gate dielectric material, forming a layer of gate electrode material over the layer of gate dielectric material, forming a hard mask layer over the layer of gate electrode material, and performing a patterning process to form the gate dielectric layer 180A and the gate electrode layer 180B. In some embodiments, the initial layer of gate dielectric material and the initial layer of gate electrode material are sacrificial layers, and the sacrificial gate dielectric layer is later replaced with a replacement gate dielectric layer and the sacrificial layer of gate electrode material is replaced with a replacement gate electrode.

In some embodiments, the gate dielectric layer 180A comprises silicon dioxide, a high-k dielectric, or some other suitable gate dielectric layer material. As used herein, the term "high-k dielectric" refers to the material having a dielectric constant, k, greater than or equal to about 3.9, which is the k value of $SiO_2$. The high-k dielectric material may comprise any suitable materials. Examples of the high-k dielectric material include, but are not limited to, $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, $SiON$, $SiN_x$, a silicate thereof, an alloy thereof, and/or other suitable materials. Each value of x is independently from 0.5 to 3, and each value of y is independently from 0 to 2. In some embodiments, the gate dielectric layer 180A comprises a native oxide layer formed by exposure of the semiconductor arrangement 100 to oxygen at various points in the process flow, causing the formation of silicon dioxide on exposed surfaces. In some embodiments, an additional layer of dielectric material, such as comprising silicon dioxide, a high-k dielectric material, and/or other suitable materials, is formed over the native oxide to form the gate dielectric layer 180A.

In some embodiments, the gate electrode layer 180B comprises polysilicon, metal, or some other suitable gate electrode material. A metal gate electrode layer may comprise a barrier layer, one or more work function material layers, a seed layer, a metal fill layer, and/or other suitable layers. In some embodiments, the metal fill layer comprises tungsten, aluminum, copper, cobalt, and/or other suitable materials. In some embodiments, the gate dielectric layer 180A and/or the one or more layers that comprise the gate electrode layer 180B are formed by at least one of atomic layer deposition (ALD), physical vapor deposition (PVD), chemical vapor deposition (CVD), low pressure CVD (LPCVD), atomic layer chemical vapor deposition (AL-CVD), ultrahigh vacuum CVD (UHVCVD), reduced pressure CVD (RPCVD), molecular beam epitaxy (MBE), plating, or other suitable techniques.

Figure 9:
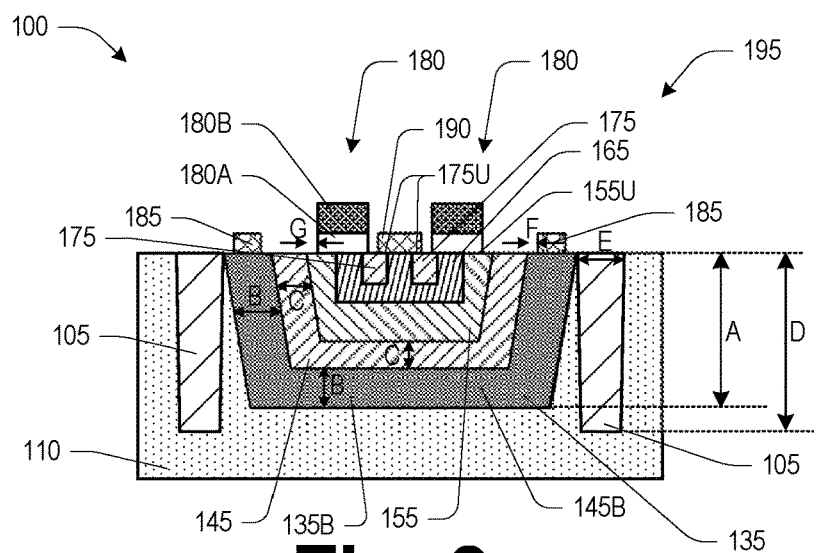

Referring to FIG. 9, collector contacts 185 contacting the surface 135U of the collector region 135 and an emitter contact 190 contacting the surface 165U of the body region 165 and a portion of the surfaces 175U of the body contacts 175 are formed, in accordance with some embodiments. For ease of illustration, the collector contacts 185 and the emitter contact 190 are illustrated in simplified form, omitting one or more dielectric materials separating the collector contacts 185 and the emitter contact 190 from the gate structures 180. The collector contacts 185 and the emitter contact 190 may be formed in any number of ways, such as by a single damascene process, a dual damascene process, a silicide process, and/or other suitable techniques. In some embodiments, the collector contacts 185 and the emitter contact 190 are in different positions, such as into or out of the page. In some embodiments, the collector contacts 185 and the emitter contact 190 comprise a barrier layer, a seed layer, a metal fill layer, and/or other suitable layers. In some embodiments, the metal fill layer comprises tungsten, aluminum, copper, cobalt, and/or other suitable materials. In some embodiments, the collector contacts 185 and the emitter contact 190 comprise a metal silicide. Other structures and/or configurations of the collector contacts 185 and the emitter contact 190 are within the scope of the present disclosure. For example, each collector contact 185 may comprise multiple contacts formed over the collector region 135 at different positions.

Figure 10:
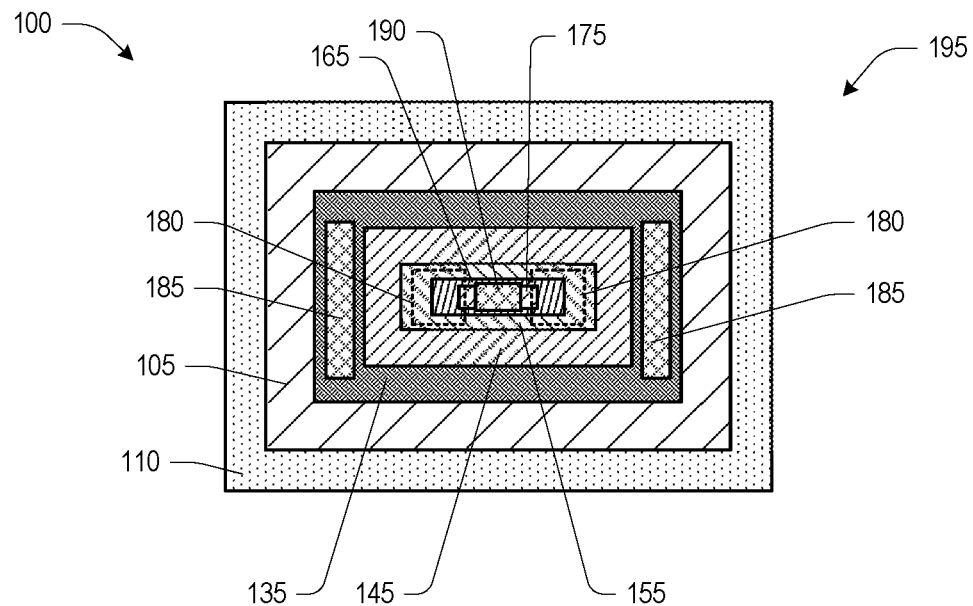

Referring to FIG. 10, a top view of the semiconductor arrangement 100 is shown, in accordance with some embodiments. In some embodiments, the semiconductor arrangement 100 illustrated in FIGS. 9 and 10 is an IGBT 195 with surface gate structures 180. In some embodiments, a length of the emitter contact 190 is less than a length of the gate structure 180, wherein the length of the emitter contact 190 and the length of the gate structure 180 are measured in a direction (e.g., vertical direction on the page) that is perpendicular to a direction from one of the gate structures 180 to another one of the gate structures 180 (e.g., a horizontal direction on the page).

In some embodiments, referring to FIGS. 9 and 10, the IGBT 195 has a depth, A, of about 2 μm200 μm, a thickness, B, of the collector region 135 is about 0.1 μm to 1 μm, a thickness, C, of the buffer layer 145 is about 0.05 μm to 1 μm, a depth, D, of the DTI structure 105 is about 4 μm to 220 μm, the difference between A and D is about at least 0.5 μm, a width, E, of the DTI structure 105 is about at least 10 μm, a spacing, F, between the collector contact and the buffer layer 145 is about at least 0.1 μm, a spacing between the DTI structure 105 and the collector region 135 is between about 0 and 1 μm or between about 0 and 10 μm, and a distance, G, between the gate structure 180 and the buffer layer 145 is about at least 0.1 μm.

In some embodiments, an off state of the IGBT 195 is realized with a voltage applied to the gate structures 180 of 0V and a voltage between the collector contacts 185 and the emitter contact 190 between about 0V-500V or with a voltage between the collector contacts 185 and the emitter contact 190 of 0V and a voltage applied to the gate structures 180 of about 0V-50V. In some embodiments, an on state of the IGBT 195 is realized with a voltage applied to the gate structures 180 of about 0V-50V and a voltage between the collector contacts 185 and the emitter contact 190 between about 0V-50V.

Figure 11:
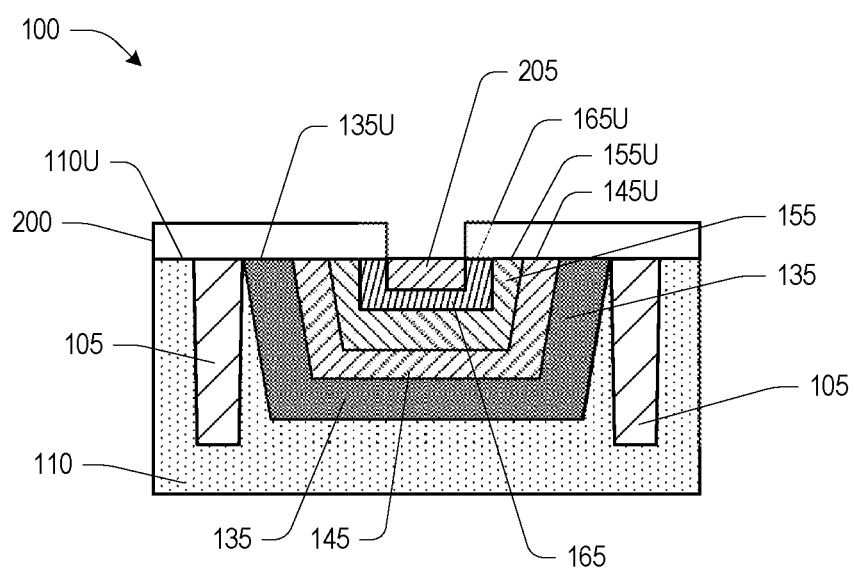
FIGS. 11-14 are illustrations of a semiconductor arrangement at various stages of fabrication, in accordance with some embodiments.

FIGS. 11-14 illustrate a semiconductor arrangement 100 at various stages of fabrication, in accordance with some embodiments. Referring to FIG. 11, starting with the semiconductor arrangement 100 shown in FIG. 6, the mask 160 is removed, a mask 200 is formed over the semiconductor layer 110, the surface 135U of the collector region 135, the surface 145U of the buffer layer 145, the portion of the surface 155U of the drift region 155, and portions of the body region 165, and a body contact 205 is formed in the body region 165, in accordance with some embodiments. In some embodiments, the mask 200 is formed using at least one of a hard mask layer, a BARC layer, an OPL, or a photoresist layer comprising materials and formed as described herein. In some embodiments, an implantation process using the mask 200 as an implantation template is performed to introduce an impurity into the body region 165 to form the body contact 205. The impurity may be an n-type dopant, such as at least one of phosphorous, arsenic, or other suitable n-type dopants. In some embodiments, the body contact 205 has an n+ dopant concentration.

Figure 12:
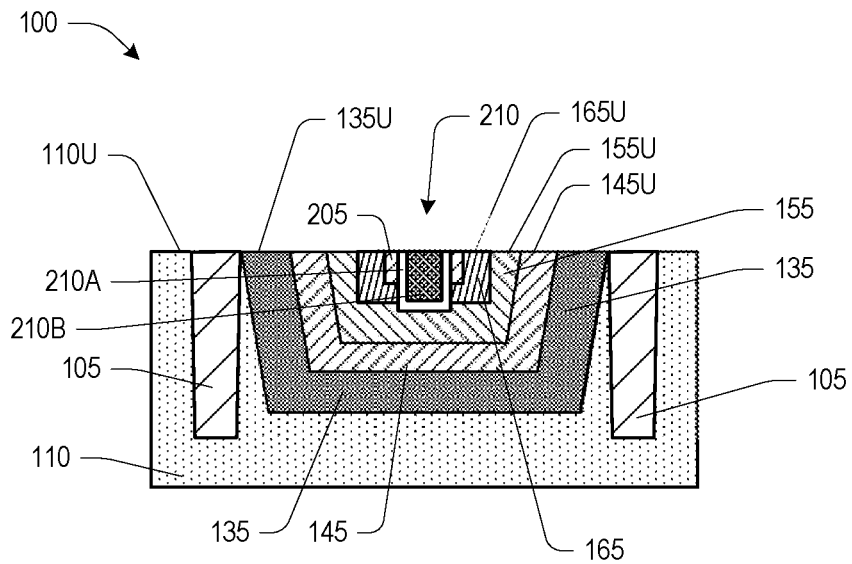

Referring to FIG. 12, the mask 200 is removed and a gate structure 210 is formed, in accordance with some embodiments. In some embodiments, the gate structure 210 is embedded in a portion of the drift region 155, a portion of the body region 165, and a portion of the body contact 205. According to some embodiments, the gate structure 210 comprises a gate dielectric layer 210A and a gate electrode layer 210B. In some embodiments, the gate structure 210 is formed by forming a trench in the body contact 205, the body region 165, and the drift region 155 using a patterned etching process, and the gate dielectric layer 180A and the gate electrode layer 180B are formed in the trench. In some embodiments, the gate structure 210 is formed using a replacement gate process as described herein.

Figure 13:
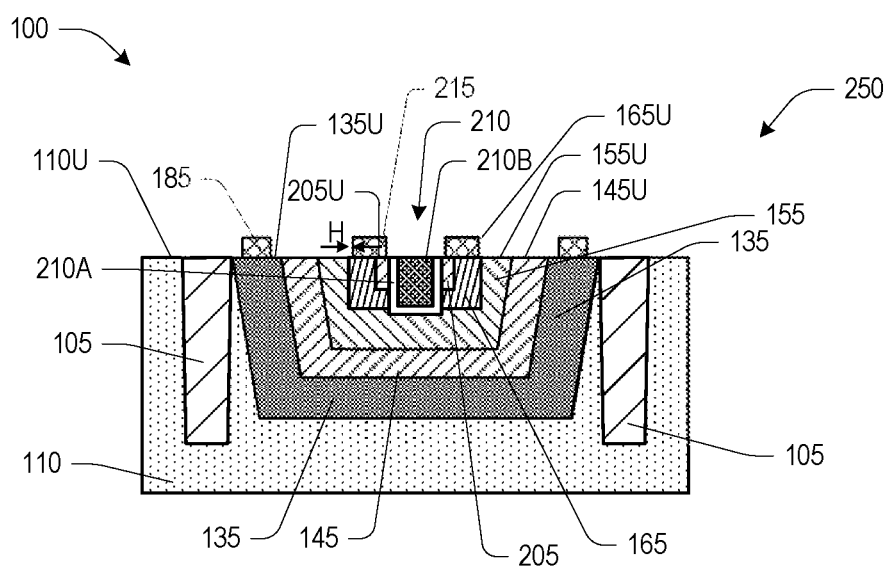

Referring to FIG. 13, collector contacts 185 contacting the surface 135U of the collector region 135 and an emitter contact 215 contacting the surface 165U of the body region 165 and a portion of a surface 205U of the body contact 205 are formed, in accordance with some embodiments. For ease of illustration, the collector contacts 185 and the emitter contact 215 are illustrated in simplified form, omitting one or more dielectric materials separating the collector contacts 185 and the emitter contact 215. The collector contacts 185 and the emitter contact 215 may be formed in any number of ways, such as by a single damascene process, a dual damascene process, a silicide process, and/or other suitable techniques. In some embodiments, the collector contacts 185 and the emitter contact 215 comprise a barrier layer, a seed layer, a metal fill layer, and/or other suitable layers. In some embodiments, the metal fill layer comprises tungsten, aluminum, copper, cobalt, and/or other suitable materials. In some embodiments, the collector contacts 185 and the emitter contact 215 comprise a metal silicide. Other structures and/or configurations of the collector contacts 185 and the emitter contact 215 are within the scope of the present disclosure. For example, each collector contact 185 may comprise multiple contacts formed over the collector region 135 at different positions.

Figure 14:
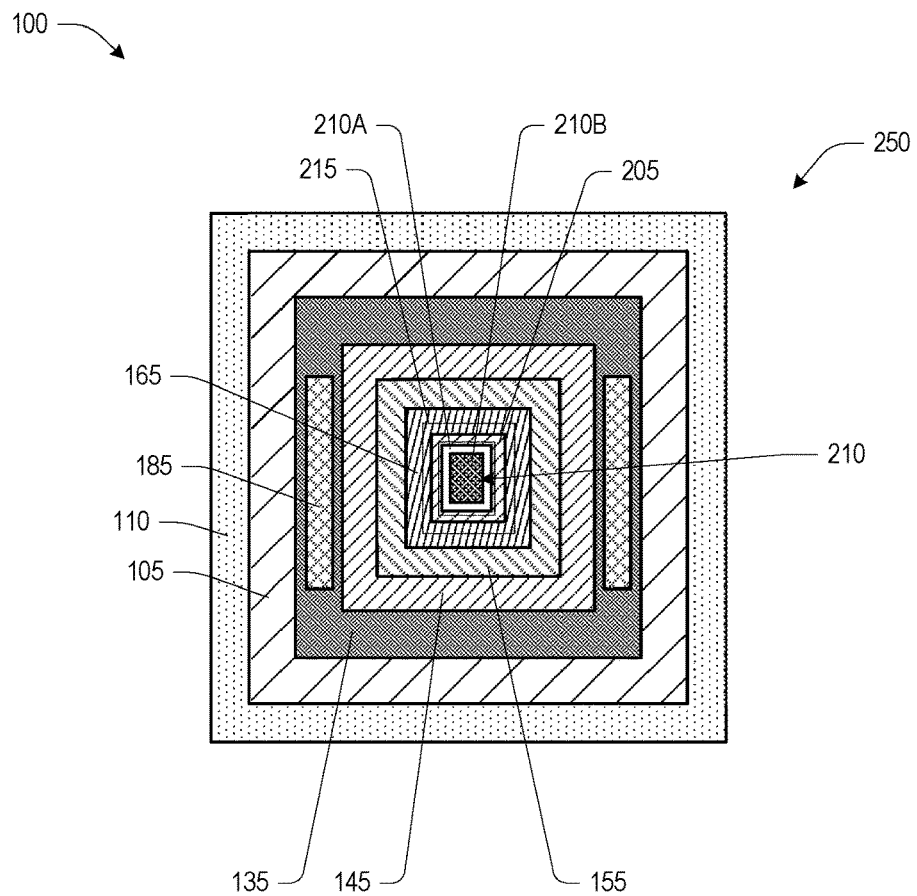

Referring to FIG. 14, a top view of the semiconductor arrangement 100 is shown, in accordance with some embodiments. In some embodiments, the semiconductor arrangement 100 illustrated in FIGS. 13 and 14 is an IGBT 250 with a trench gate structure 210. In some embodiments, the IGBT 250 has dimensions A, B, C, D, E, and F that are similar to those illustrated for the IGBT 195 in FIG. 9. A spacing, H, between the emitter contact 215 and the drift region 155 is about at least 0.1 μm.

In some embodiments, an off state of the IGBT 250 is realized with a voltage applied to the gate structure 210 of 0V and a voltage between the collector contacts 185 and the emitter contact 215 between about 0V-500V or with a voltage between the collector contacts 185 and the emitter contact 215 of 0V and a voltage applied to the gate structure 210 of about 0V-50V. In some embodiments, an on state of the IGBT 250 is realized with a voltage applied to the gate structure 210 of about 0V-50V and a voltage between the collector contacts 185 and the emitter contact 215 between about 0V-50V.

According to some embodiments, the collector region 135, the buffer layer 145, the drift region 155, and the body region 165 define a vertical PNP transistor, the buffer layer 145, the drift region 155, the body region 165, and the body contacts 175 define a vertical NPN transistor, and the buffer layer 145, the drift region 155, the body region 165, the body contacts 175, and the gate structures 180, 210 define two parallel horizontal MOSFET transistors. The drift region 155 serves as a base for the vertical PNP transistor and a drain of the MOSFET transistors. The body region 165 serves as an emitter of the vertical PNP transistor, a body of the MOSFET transistors, and a base of the vertical NPN transistor. The body contacts 175 serve as a source for the MOSFET transistors and a collector of the vertical NPN transistor.

Figure 15:
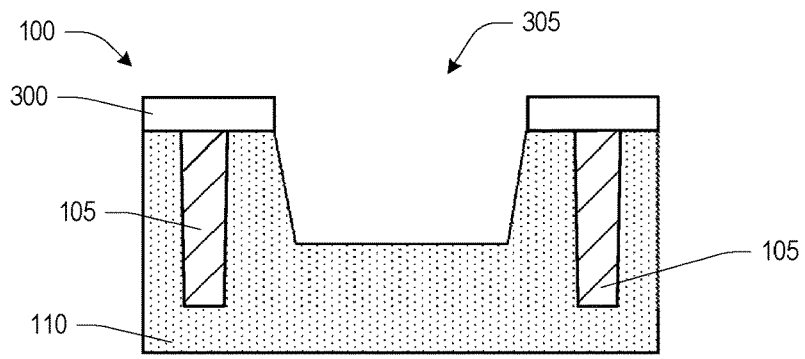
FIGS. 15-18 are illustrations of a semiconductor arrangement at various stages of fabrication, in accordance with some embodiments.

FIGS. 15-18 illustrate a semiconductor arrangement 100 at various stages of fabrication, in accordance with some embodiments. Referring to FIG. 15, starting with the semiconductor arrangement of FIG. 1, a mask 300 is formed over the semiconductor layer 110 and a recess 305 is formed in the semiconductor layer 110 using the mask 300 as a removal template, in accordance with some embodiments. In some embodiments, the mask 300 is formed using at least one of a hard mask layer, a BARC layer, an OPL, or a photoresist layer comprising materials and formed as described herein. In some embodiments, the recess 305 is formed in the semiconductor layer 110 by performing an etching processes to remove portions of the semiconductor layer 110 exposed by the mask 300. The etching process comprises at least one of a plasma etching process, a reactive ion etching (RIE) process, or other suitable techniques. In some embodiments, the recess 305 is a trench. Other structures and configurations of the recess 305 are within the scope of the present disclosure.

Figure 16:
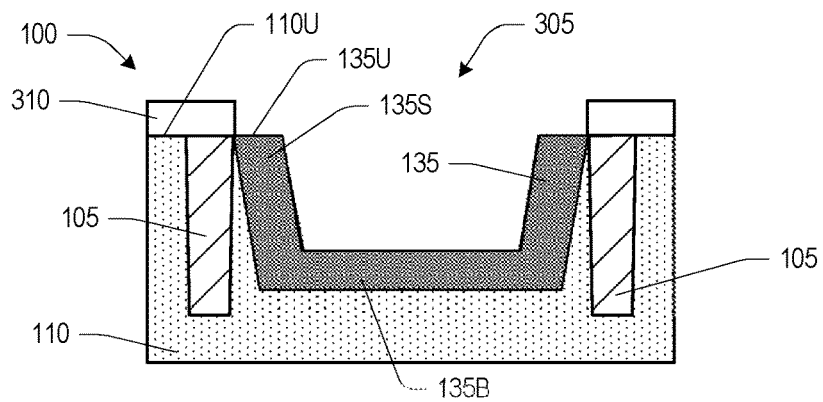

Referring to FIG. 16, the mask 300 is removed, a mask 310 is formed, and the collector region 135 is formed in the recess 305. In some embodiments, the mask 310 is formed using at least one of a hard mask layer, a BARC layer, an OPL, or a photoresist layer comprising materials and formed as described herein. In some embodiments, an implantation process using the mask 310 as an implantation template is performed to introduce an impurity into the semiconductor layer 110 proximate the recess 305 to form the collector region 135. The impurity may be a p-type dopant, such as at least one of boron, $BF_2$, aluminum, gallium, indium, or other suitable p-type dopants. In some embodiments, the collector region 135 includes a bottom portion 135B and a sidewall portion 135S extending from the bottom portion 135B. The sidewall portion 135S has a surface 135U substantially coplanar with an upper surface 110U of the semiconductor layer 110.

Figure 17:
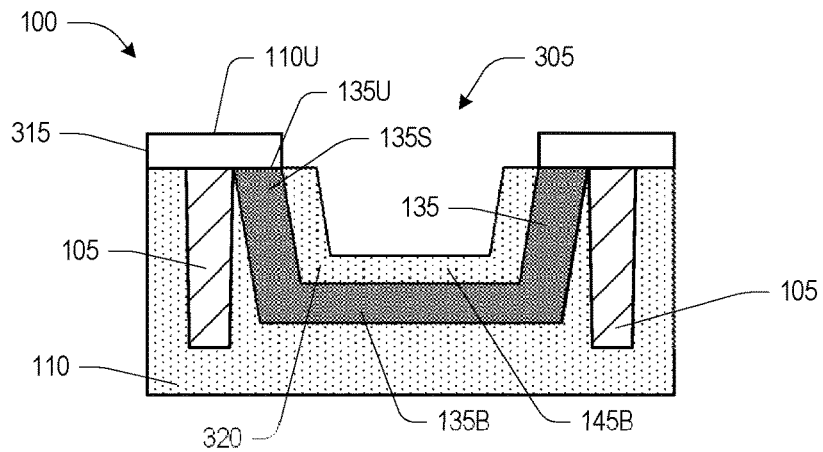

Referring to FIG. 17, the mask 310 is removed, a mask 315 is formed over the semiconductor layer 110 and the surface 135U of the collector region 135, and an epitaxial layer 320 is formed in the recess 305 over the collector region 135, in accordance with some embodiments. In some embodiments, the mask 315 is formed using at least one of a hard mask layer, a BARC layer, an OPL, or a photoresist layer comprising materials and formed as described herein. In some embodiments, an epitaxial growth process is performed to form the epitaxial layer 320.

Figure 18:
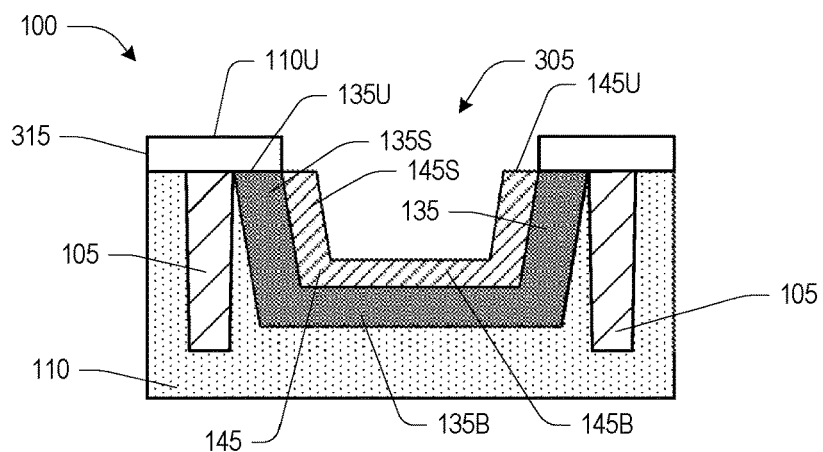

Referring to FIG. 18, the buffer layer 145 is formed in the epitaxial layer 320, in accordance with some embodiments. In some embodiments, an implantation process using the mask 315 as an implantation template is performed to introduce an impurity into the epitaxial layer 320 to form the buffer layer 145. The impurity may be an n-type dopant, such as at least one of phosphorous, arsenic, or other suitable n-type dopants. In some embodiments, the buffer layer 145 includes a bottom portion 145B and a sidewall portion 145S extending from the bottom portion 145B. The sidewall portion 145S has a surface 145U substantially coplanar with the upper surface 110U of the semiconductor layer 110. In some embodiments, the surface 145U of the buffer layer 145 is substantially coplanar with the surface 135U of the collector region 135. In some embodiments, the buffer layer 145 is omitted.

According to some embodiments, the processing in FIGS. 5-10 may be performed to form an IGBT with surface gate structures 180 or the processing in FIGS. 5, 6, and 11-14 may be performed to form an IGBT with a trench gate structure 210.

Figure 19:
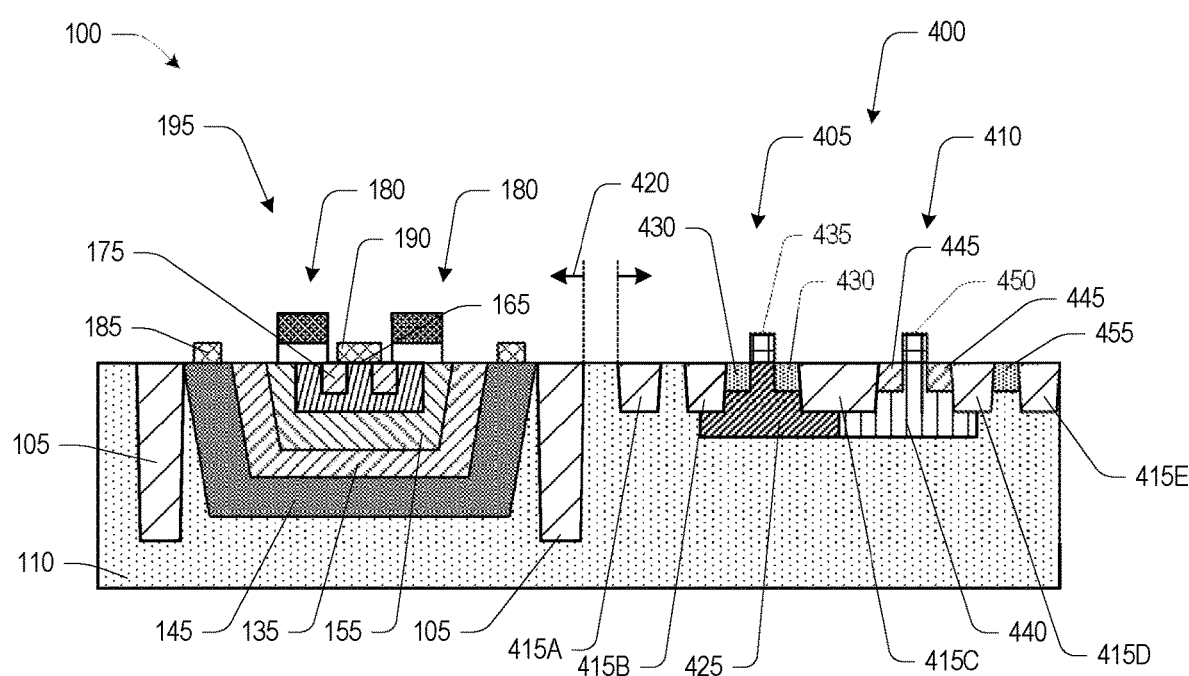
FIGS. 19-21 are illustrations of a semiconductor arrangement, in accordance with some embodiments.
Figure 20:
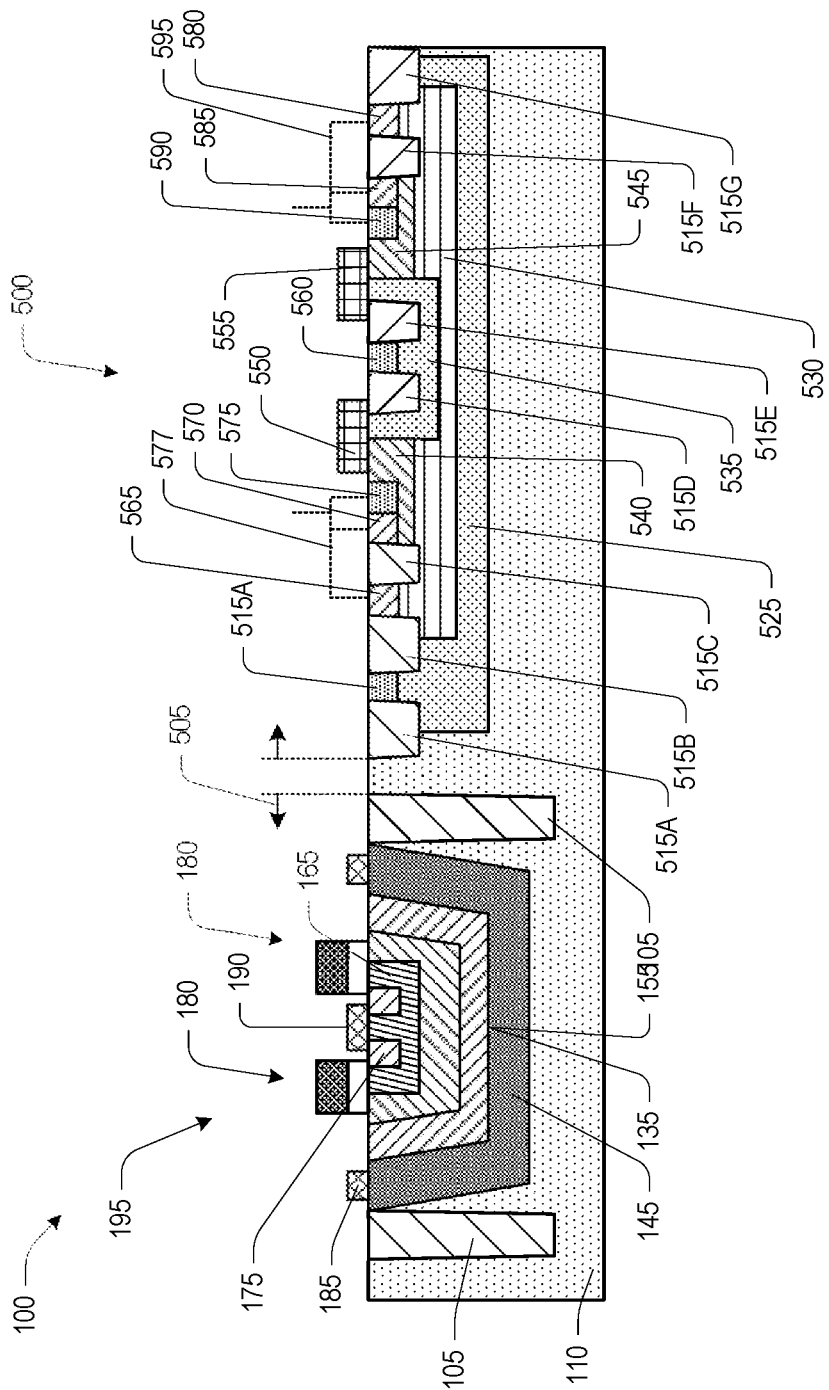
Figure 21:
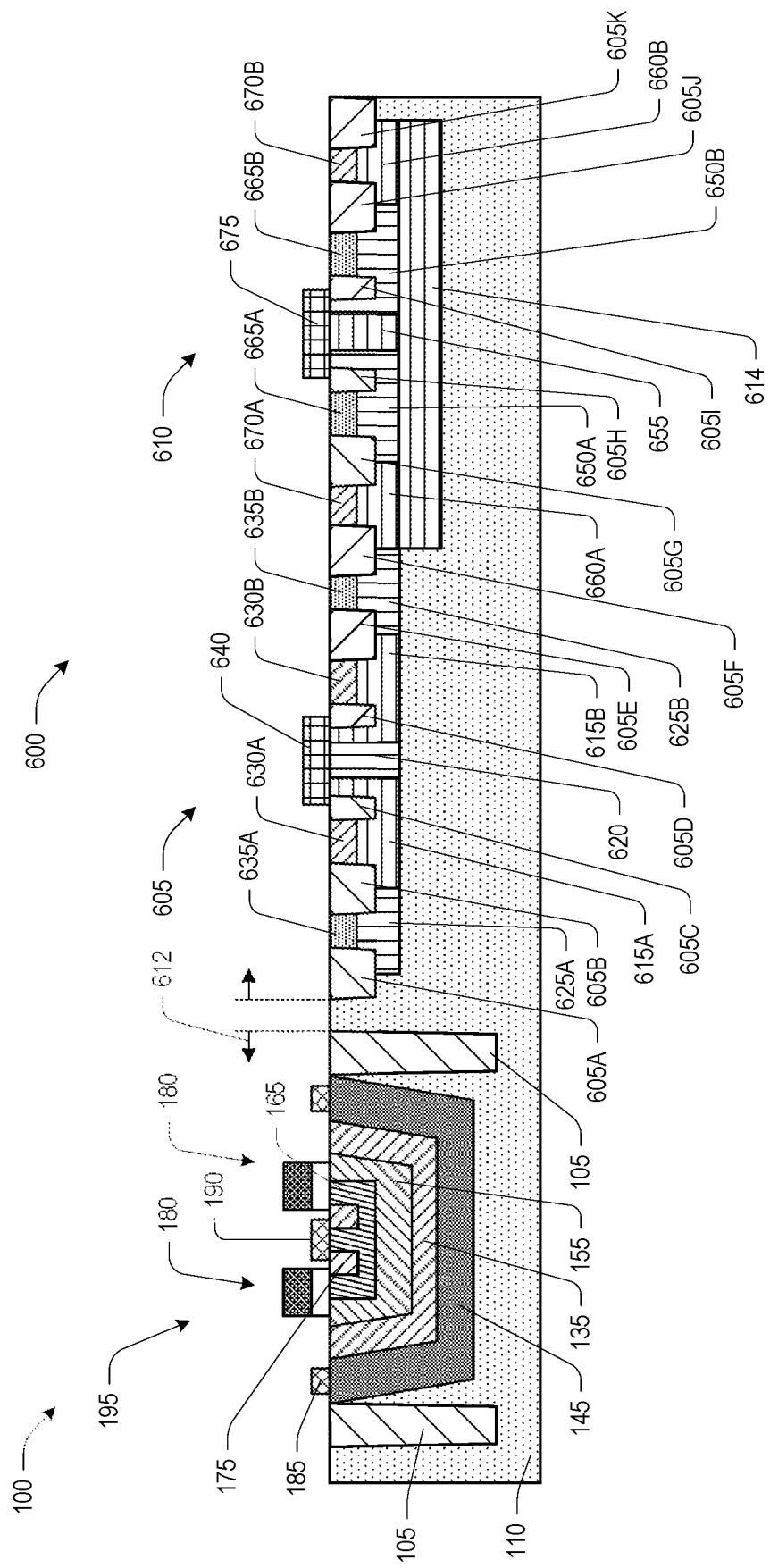

FIGS. 19-21 are illustrations of embodiments of a semiconductor arrangement 100, in accordance with some embodiments. FIG. 19 illustrates the IGBT 195 formed adjacent a complementary metal oxide semiconductor (CMOS) device 400 using an integrated process flow, in accordance with some embodiments. Although the IGBT 195 of FIG. 10 is illustrated in FIG. 19, the IGBT 250 of FIG. 14 may also be fabricated adjacent the CMOS device 400.

In some embodiments, the CMOS device 400 comprises a p-type MOS (PMOS) device 405 and an n-type MOS (NMOS) device 410. The IGBT 195 and the CMOS device 400 are separated by the DTI structure 105 and a shallow trench isolation (STI) structure 415A. In some embodiments, a spacing 420 between the IGBT 195 and the CMOS device 400 is about at least 10 μm. The DTI structure 105 has a depth greater than a depth of the STI structure 415A.

The PMOS device 405 comprises an n-well region 425 under and between STI structures 415B, 415C, p-type source/drain regions 430 in the n-well region 425, and a gate structure 435. The NMOS device 410 comprises a p-well region 440 under and between the STI structure 415C and an STI structure 415D, n-type source/drain regions 445 in the p-well region 440, and a gate structure 450. The CMOS device 400 comprises a p-type bulk contact 455 in the semiconductor layer 110 between the STI structure 415D and an STI structure 415E. Other structures and configurations of the CMOS device 400, the PMOS device 405, and/or the NMOS device 410 are within the scope of the present disclosure.

FIG. 20 illustrates the IGBT 195 formed adjacent a laterally diffused metal oxide semiconductor (LDMOS) device 500 using an integrated process flow, in accordance with some embodiments. Although the IGBT 195 of FIG. 10 is illustrated in FIG. 19, the IGBT 250 of FIG. 14 may also be fabricated adjacent the LDMOS device 500.

The LDMOS device 500 comprises STI structures 515A-515G. The DTI structure 105 has a depth greater than a depth of the STI structures 515A-515G. The IGBT 195 and the LDMOS device 500 are separated by the DTI structure 105 and the STI structure 515A. In some embodiments, a spacing 505 between the IGBT 195 and the LDMOS device 500 is about at least 10 μm. The LDMOS device 500 comprises a deep n-well region 525 under and between the STI structures 515A-515G, a p-well region 530 under and between the STI structures 515B-515G, an n-well region 535 under and adjacent the STI structures 515D, 515E, a lightly-doped p-well region 540 between the STI structure 515C and the n-well region 535, and a lightly-doped p-well region 545 between the STI structure 515F and the n-well region 535. A gate structure 550 is formed over a portion of the n-well region 535 and a portion of the lightly-doped p-well region 540, and a gate structure 555 is formed over a portion of the n-well region 535 and a portion of the lightly-doped p-well region 545. An n-type drain region 560 is in the n-well region 535 between the STI structures 515D, 515E. P-type source regions 565, 570 adjacent the STI structure 515C and an n-type source region 575 adjacent the p-type source region 570 collectively form a first butted source 577, and P-type source regions 580, 585 adjacent the STI structure 515F and an n-type source region 590 adjacent the p-type source region 585 collectively form a second butted source 595. Other structures and configurations of the LDMOS device 500 are within the scope of the present disclosure.

FIG. 21 illustrates the IGBT 195 formed adjacent a high voltage metal oxide semiconductor (HVMOS) device 600 using an integrated process flow, in accordance with some embodiments. Although the IGBT 195 of FIG. 10 is illustrated in FIG. 21, the IGBT 250 of FIG. 14 may also be fabricated adjacent the HVMOS device 600.

In some embodiments, the HVMOS device 600 comprises a high voltage n-type MOS (HV NMOS) device 605 and a high voltage p-type MOS (HV PMOS) device 610. The HVMOS device 600 comprises STI structures 605A-605K. The DTI structure 105 has a depth greater than a depth of the STI structures 605A-605K. The IGBT 195 and the HVMOS device 600 are separated by the DTI structure 105 and the STI structure 605A. In some embodiments, a spacing 612 between the IGBT 195 and the HVMOS device 600 is about at least 10 μm.

The HV NMOS device 605 comprises an n-well region 615A under and adjacent the STI structures 605B, 605C, an n-well region 615B under and between the STI structures 605D, 605E, a p-well region 620 between the n-well regions 615A, 615B, a p-well region 625A under and between the STI structure 605A, 605B, and a p-well region 625B under and between the STI structures 605E, 605F. N-type source/drain regions 630A, 630B are in the n-well regions 615A, 615B, respectively. P-type bulk contacts 635A, 635B are in the p-well regions 625A, 625B, respectively. A gate structure 640 is over portions of the n-well regions 615A, 615B and the p-well region 620.

The HV PMOS device 610 comprises a deep n-well region 614 under and between the STI structures 605F-605K, a p-well region 650A under and adjacent the STI structures 605G, 605H, a p-well region 650B under and between the STI structures 605I, 605J, an n-well region 655 between the p-well regions 650A, 650B, an n-well region 660A under and between the STI structure 605F, 605G, and an n-well region 660B under and between the STI structures 605J, 605K. P-type source/drain regions 665A, 665B are in the p-well regions 650A, 650B, respectively. N-type bulk contacts 670A, 670B are in the n-well regions 660A, 660B, respectively. A gate structure 675 is over portions of the p-well regions 650A, 650B and the n-well region 655. Other structures and configurations of the HVMOS device 600, the HV NMOS device 605, and/or the HV PMOS device 610 are within the scope of the present disclosure.

The IGBTs 195, 250 described herein provide advantages of vertical IGBT devices with respect to high current gain and the advantages of lateral IGBT devices with respect to planar emitter and collector contacts on the same surface of the semiconductor layer 110. The process flow for forming the IGBTs 195, 250 allows process integration with other devices, such as the CMOS device 400 of FIG. 19, the LDMOS device 500 of FIG. 20, and/or the HVMOS device 600 of FIG. 21.

In some embodiments, a method of forming a semiconductor arrangement includes forming a first recess in a semiconductor layer, forming a collector region in the first recess, forming a drift region in the first recess over the collector region, and forming a body region in the first recess over the drift region. A body contact is formed in the body region, an emitter contact contacting the body contact and the body region is formed, and a collector contact contacting the collector region is formed. A first gate structure is formed adjacent the drift region, the body region, and the body contact.

In some embodiments, a semiconductor arrangement includes a collector region comprising a bottom portion and a sidewall portion extending from the bottom portion to a first surface of a semiconductor layer, a drift region over the collector region, and a body region over the drift region. A body contact is in the body region. An emitter contact contacts the body contact and the body region. A collector contact contacts a first surface of the sidewall portion of the collector region coplanar with the first surface of the semiconductor layer. A first gate structure is adjacent the drift region, the body region, and the body contact.

In some embodiments, a semiconductor arrangement includes a collector region having a first surface coplanar with a first surface of a semiconductor layer, a drift region over a portion of the collector region and having a first surface coplanar with the first surface of the semiconductor layer, and a body region over the drift region. A body contact is in the body region. An emitter contact contacts the body contact and the body region. A collector contact contacts the first surface of the collector region. A first gate structure is adjacent the first surface of the drift region, the body region, and the body contact.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a collector region comprising a bottom portion and a sidewall portion extending from the bottom portion to a first surface of a semiconductor layer;
   a drift region over the collector region;
   a buffer layer between the collector region and the drift region and having an uppermost surface co-planar with the first surface of the semiconductor layer;
   a body region over the drift region;
   a first body contact and a second body contact in the body region;
   an emitter contact contacting the first body contact, the second body contact, and the body region;
   a collector contact contacting a first surface of the sidewall portion of the collector region coplanar with the first surface of the semiconductor layer, wherein the collector contact is spaced apart from drift region;
   a first gate structure directly contacting the drift region, the body region, and the first body contact, wherein in a first direction parallel to the first surface of the semiconductor layer, a length of the emitter contact is less than a length of the first gate structure; and
   a second gate structure separated from the first gate structure and directly contacting the drift region, the body region, and the second body contact, wherein the first direction is perpendicular to a direction extending from the first gate structure to the second gate structure.

2. The semiconductor arrangement of claim 1, comprising:
   an isolation structure adjacent the collector region and having a first depth greater than a second depth of the collector region.

3. The semiconductor arrangement of claim 1, wherein:
   the first gate structure contacts a first surface of the drift region coplanar with the first surface of the semiconductor layer.

4. The semiconductor arrangement of claim 1, wherein:
   the first gate structure is embedded in the first body contact, the body region, and the drift region.

5. A semiconductor arrangement, comprising:
   a collector region having a first surface coplanar with an uppermost surface of a semiconductor layer;
   a drift region over a portion of the collector region and having a first surface coplanar with the uppermost surface of the semiconductor layer;
   a buffer layer between the collector region and the drift region and separating a sidewall of the drift region facing the collector region from a sidewall of the collector region facing the drift region;
   a body region over the drift region and having an uppermost surface coplanar with the uppermost surface of the semiconductor layer;
   a first body contact in the body region;
   a second body contact in the body region and separated from the first body contact by a portion of the body region extending continuously between the first body contact and the second body contact;
   an emitter contact directly contacting the first body contact, the second body contact, and the portion of the body region;
   a first collector contact contacting the first surface of the collector region;
   a first gate structure adjacent the first surface of the drift region, the body region, and the first body contact wherein in a first direction parallel to the uppermost surface of the semiconductor layer, a length of the emitter contact is less than a length of the first gate structure; and a second gate structure overlying the drift region, the body region, and the second body contact, wherein the first direction is perpendicular to a direction extending from the first gate structure to the second gate structure.

6. The semiconductor arrangement of claim 5, wherein the buffer layer has a first surface coplanar with the uppermost surface of the semiconductor layer.

7. The semiconductor arrangement of claim 5, wherein: the first gate structure contacts the first surface of the drift region.

8. The semiconductor arrangement of claim 5, wherein: the first gate structure is embedded in the first body contact, the body region, and the drift region.

9. The semiconductor arrangement of claim 1, wherein: the first gate structure comprises a gate dielectric layer in contact with the first body contact, the body region, and the drift region.

10. The semiconductor arrangement of claim 1, wherein: the first gate structure comprises a gate dielectric layer having a sidewall in contact with the first body contact and the body region and a bottom surface in contact with the drift region.

11. The semiconductor arrangement of claim 10, wherein: the sidewall of the gate dielectric layer is in contact with the drift region.

12. The semiconductor arrangement of claim 1, wherein a length of the collector contact measured in the first direction is greater than the length of the first gate structure.

13. A semiconductor arrangement, comprising:
a collector region;
a drift region over the collector region, wherein the drift region is laterally between a first sidewall of the collector region and a second sidewall of the collector region;
a buffer layer between the collector region and the drift region and separating a sidewall of the drift region facing the collector region from a sidewall of the collector region facing the drift region;
a body region over the drift region;
a first body contact in the body region;
a second body contact in the body region and separated from the first body contact by a portion of the body region extending continuously between the first body contact and the second body contact;
an emitter contact contacting the first body contact, the second body contact, and the portion of the body region;
a first gate structure overlying the drift region, the body region, and the first body contact, wherein in a first direction parallel to an uppermost surface of the collector region, a length of the emitter contact is less than a length of the first gate structure; and
a second gate structure overlying the drift region, the body region, and the second body contact, wherein the first direction is perpendicular to a direction extending from the first gate structure to the second gate structure.

14. The semiconductor arrangement of claim 13, comprising:
a collector contact contacting the collector region, wherein the first gate structure is between the collector contact and the emitter contact.

15. The semiconductor arrangement of claim 13, wherein the first gate structure is in direct contact with the drift region, the body region, and the first body contact.

16. The semiconductor arrangement of claim 13, wherein the a second gate structure in contact with the drift region, the body region, and the second body contact.

17. The semiconductor arrangement of claim 13, wherein: the emitter contact is between the first gate structure and the second gate structure.

18. The semiconductor arrangement of claim 5, comprising:
a deep trench isolation (DTI) structure forming a ring around the collector region.

19. The semiconductor arrangement of claim 5, comprising:
a second collector contact, wherein the second collector contact is disposed on an opposite side of the drift region relative to the first collector contact.

20. The semiconductor arrangement of claim 5 wherein a length of the first collector contact measured in the first direction is greater than the length of the first gate structure.

* * * * *